(12) United States Patent
Colombo et al.

(10) Patent No.: US 6,242,793 B1
(45) Date of Patent: Jun. 5, 2001

(54) METHOD AND A CIRCUIT FOR IMPROVING THE EFFECTIVENESS OF ESD PROTECTION IN CIRCUIT STRUCTURES FORMED IN A SEMICONDUCTOR

(75) Inventors: Paolo Colombo, Tradate; Emilio Camerlenghi, Bergamo, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/231,129

(22) Filed: Dec. 30, 1998

(30) Foreign Application Priority Data

Dec. 31, 1997 (EP) .................................................. 97830742

(51) Int. Cl.[7] .................................................. H01L 29/73
(52) U.S. Cl. .......................................... 257/556; 257/575
(58) Field of Search ..................................... 257/373, 423, 257/511, 525, 556, 557, 575; 438/204, 236, 311, 316, 325, 327, 335, 341, 357, 370, 378, 409, 495, 549, 552, 577

(56) References Cited

U.S. PATENT DOCUMENTS 5,268,588 * 12/1993 Marum .
5,341,005 * 8/1994 Canclini .
5,506,742 * 4/1996 Marum .
5,877,534 * 3/1999 Williams et al. .

FOREIGN PATENT DOCUMENTS

680090 A1   11/1995  (EP) .

OTHER PUBLICATIONS

Cavone et al., "A Method for the Characterization and Evaluation of ESD Protection Structures and Networks," *Journal of Electrostatics* 36(1): 109–125, Nov. 1995.

* cited by examiner

Primary Examiner—George Fourson
Assistant Examiner—Joannie A. Garcia
(74) Attorney, Agent, or Firm—Theodore E. Galanthay; Robert Iannucci; Seed IP Law Group PLLC

(57) ABSTRACT

A method and a related circuit structure are described for improving the effectiveness of ESD protection in circuit structures realized in a semiconductor substrate overlaid with an epitaxial layer and including at least one ESD protection lateral bipolar transistor realized in the surface of the epitaxial layer. The method consists of forming under the transistor an isolating well that isolates the transistor from the substrate. Advantageously, the transistor can be fully isolated from the substrate by first and second N wells which extend from the surface of the epitaxial layer down to and in contact with the buried well.

13 Claims, 3 Drawing Sheets

METHOD AND A CIRCUIT FOR IMPROVING THE EFFECTIVENESS OF ESD PROTECTION IN CIRCUIT STRUCTURES FORMED IN A SEMICONDUCTOR

TECHNICAL FIELD

This invention relates to a method for improving the effectiveness of ESD protection in circuit structures realized in a semiconductor substrate overlaid by an epitaxial layer and having at least one lateral ESD protection bipolar transistor realized in the surface of the epitaxial layer.

The invention also relates to an ESD-protected circuit structure of the type which is realized in a semiconductor substrate overlaid by an epitaxial layer and having at least one lateral ESD protection bipolar transistor realized in the surface of the epitaxial layer.

BACKGROUND OF THE INVENTION

As is well known, low power consumption BiCMOS processes provide for the formation, e.g., in logic circuits or memory devices, of protection structures against electrostatic discharges.

Such structures are commonly known as ESD protectors and are arranged to be active only in a particular condition, known as "snap-back", of the parasitic bipolar. This bipolar is a lateral npn transistor with field oxide (field oxide bipolar), which may undergo a breakdown from the collector terminal toward the substrate when the base-emitter junction is forward biased.

The parasitic lateral npn bipolar is commonly used, in CMOS processes with 0.5 μm technology, as a protector, since it is a parasitic component inherent to the process and its provision does not add to the cost. This transistor is biased with the base-substrate to ground, and does not interfere with proper operation of the devices; in addition, it has ESD fail limits inherently higher than 5 kV, compared to the 2 kV usually provided by the specifications.

This is definitely so where the starting substrate is P-doped silicon having a high resistivity of about ten ohms per centimeter and a much larger thickness than the dimensions of the components integrated in the substrate. For example, the wafer of semiconductor material may exit the process with a thickness of about 300 μm.

In this field of application, there is a demand for starting substrates of ever lower resistivity, even three orders of magnitude below the above-specified value. As illustrated in FIG. 3, an EPI epitaxial layer is grown over said semiconductor substrate whose resistivity exceeds that of the substrate and is about ten Ohms per centimeter, that is, same as that of the aforementioned P substrates.

This constructional expedient has been adopted to meet the requirement for immunity to the well known latch-up phenomenon that recurs more frequently with the scaling of the lateral dimensions of electronic components fabricated with BiCMOS processes.

The expanding use of low resistivity substrates overlaid with an epitaxial layer results in diminished strength of the devices to electrostatic discharges. This diminished strength affects both lateral bipolar transistors with field oxide and MOS transistors which utilize the npn bipolar as parasitic.

A marked reduction has been observed in the base resistances, for a given circuit structure. This deterioration of the base resistances has been ascertained experimentally.

For example, stressing tests carried out by the Applicant have shown that lateral npn bipolar transistors realized on semiconductor wafers having EPI epitaxial layers of different thicknesses undergo deterioration of the ESD protection when the thickness of the epitaxial layer is increased.

The appended FIG. 1 shows the results of these tests in the form of voltage vs. current plots at different thicknesses of the epitaxial layer. Performance begins to deteriorate as the EPI epitaxial layer is grown to 7 or 4 micrometers.

FIG. 2 is a voltage vs. current plot of the respective static characteristics of a lateral bipolar transistor with field oxide realized in substrates having epitaxial layers of different thicknesses.

It can be seen from this graph that the level of the trigger current increases as the thickness of the epitaxial layer decreases. The increase in current is due to that an increased number of holes injected into the low-resistivity substrate make the triggering of the bipolar snap-back phenomenon less likely to occur.

In fact, at small values of base resistance, high current levels become necessary to turn on the bipolar. On the occurrence of a large current discharge ESD), the electrons being injected from the emitter-base junction reach as far as the collector junction, and contribute the injection of additional holes into the base. This phenomenon attains a condition of equilibrium where the characteristic curve of the bipolar becomes near-linear.

The resistance along this linear segment of the characteristic is known as the "protector dynamic resistance Rd", and is dependent on the series resistances of the collector and the emitter, as well as on a smooth power-on of the structure.

A low Rd is essential to good ESD performance.

The stressing tests show that during the power-on transient, the circuit structure has a protector dynamic resistance Rd which increases inversely with the thickness of the EPI epitaxial layer. A most likely postulation is that the structure is affected by a non-smooth power-on, and this may be a major cause of the deterioration found when the structure is subjected to ESD stressing.

In all events, a current trend in the technology favors a progressive reduction of the parameters that govern the latch-up phenomenon. Thus, today's trend is toward reduced thickness of the EPI epitaxial layers, thereby exposing the electronic components to increased ESD risks.

SUMMARY OF THE INVENTION

An embodiment of this invention provides a method and related circuit structure which can improve the ESD protection of electronic devices realized by BiCMOS processes in substrates overlaid with epitaxial layers.

These overcome the drawbacks besetting prior art solutions, particularly wherein the thickness of the epitaxial layer is smaller than four micrometers.

The embodiment provides a barrier, under the lateral bipolar transistor, which isolates the transistor from the substrate.

The features and advantages of the method and circuit structure according to the invention will be apparent from the following description of an embodiment thereof, given by way of non-limiting example with reference to the accompanying drawings.

DETAILED DESCRIPTION OF THE INVENTION

Figure 1:
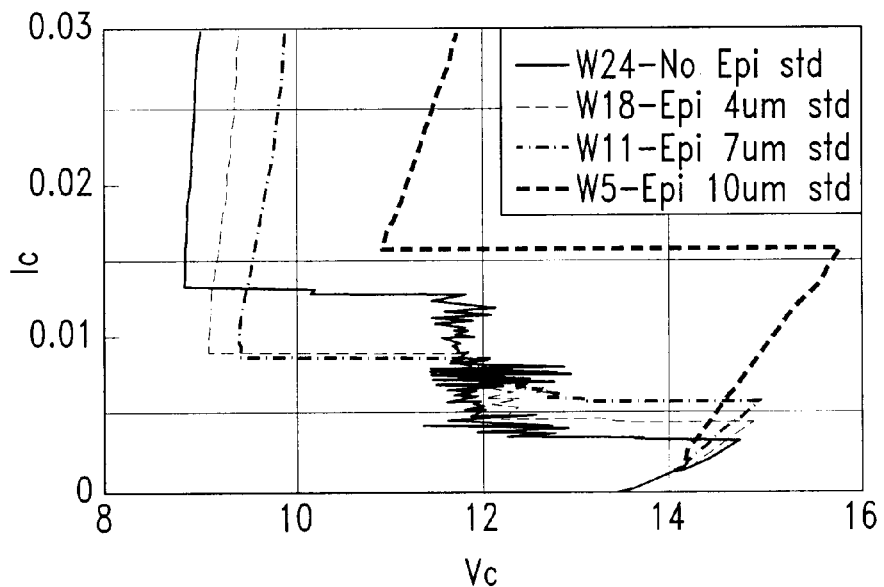
FIG. 1 shows schematically voltage vs. current plots from experimental tests carried out on ESD-protected circuit structures realized on epitaxial layers having different thicknesses.
Figure 2:
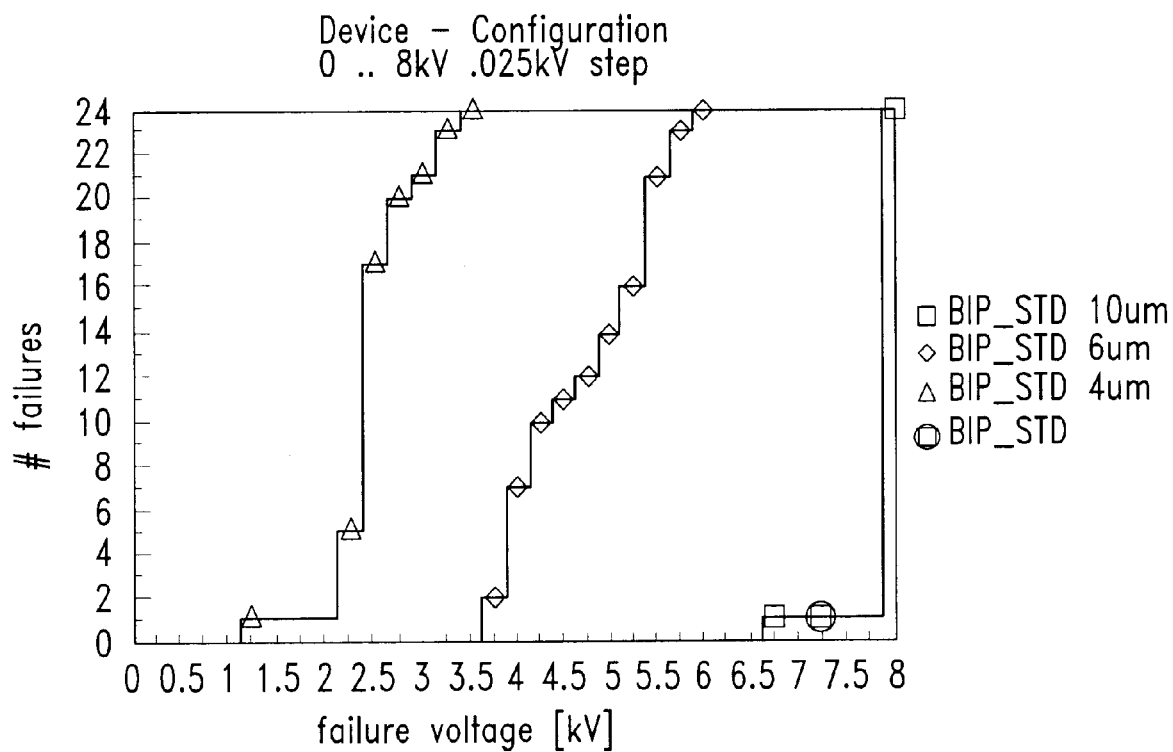
FIG. 2 is a voltage vs. current plot of the respective static characteristics of a lateral bipolar transistor with field oxide realized in substrates having epitaxial layers with different thicknesses.
Figure 3:
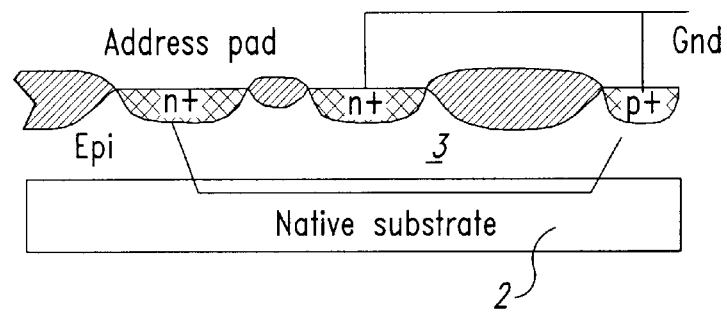
FIG. 3 is a schematic view showing, in vertical section and to an enlarged scale, a semiconductor wherein a circuit structure with ESD protection has been realized in accordance with the prior art.
Figure 4:
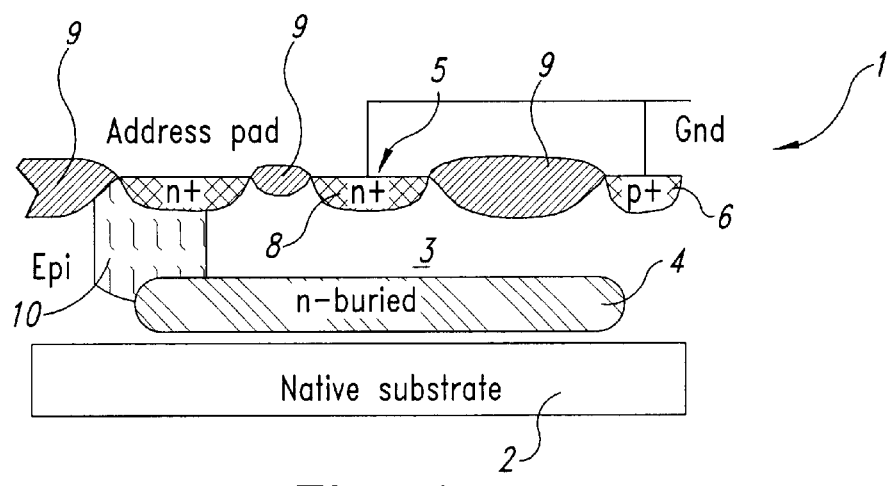
FIG. 4 is a schematic view showing, in vertical section and to an enlarged scale, a semiconductor wherein a circuit structure with ESD protection has been realized in accordance with this invention.

Referring to the drawing views, and more specifically to the example shown in FIG. 4, generally and schematically indicated at 1 is an ESD-protected circuit structure according to the invention.

The structure 1 is realized in a native semiconductor substrate 2. The substrate 2 has been doped with a predetermined amount of dopant of a first type, e.g., a P-type dopant, and has a high resistivity of a few tens ohms per centimeter.

An EPI epitaxial layer 3 has been grown to a predetermined thickness over the substrate 1.

Advantageously, a buried well 4, doped N–, is realized within the layer 3, above the substrate 2.

The well 4 is realized by an implantation of; preferably, phosphorus at high energy.

The implantation energy lies in the MeV range.

An ESD-protected field oxide lateral npn bipolar transistor 5 is realized above the buried well 4. This transistor is realized in the surface of the EPI epitaxial layer 3.

Alternatively, the transistor 5 may be a parasitic npn bipolar of an NMOS transistor having its gate terminal grounded at GND. This bipolar cannot be a vertical type, however, because the well 4 acting as the base region is lightly doped N–.

The lateral transistor 5 has a base region 6, collector region 7, and emitter region 8.

The base region 6 is a surface well doped P+. The regions 7 and 8 are surface wells doped N+.

The regions 6, 7 and 8 are realized in the surface of the epitaxial layer 3, and isolated from one another by field oxide areas 9.

Advantageously, as shown in FIG. 4, an N well 10 may be arranged to extend downwards from the collector region to contact the buried well 4. In this way, only the portion of the collector-base junction on the emitter side would be allowed to contribute to the snap-back phenomenon of the bipolar transistor 5.

In a modified embodiment of the invention, the bipolar 5 can be fully isolated from the substrate 2 by a second N well 11 extending downwards from a contact region 12 to contact the buried well 4.

Figure 5:
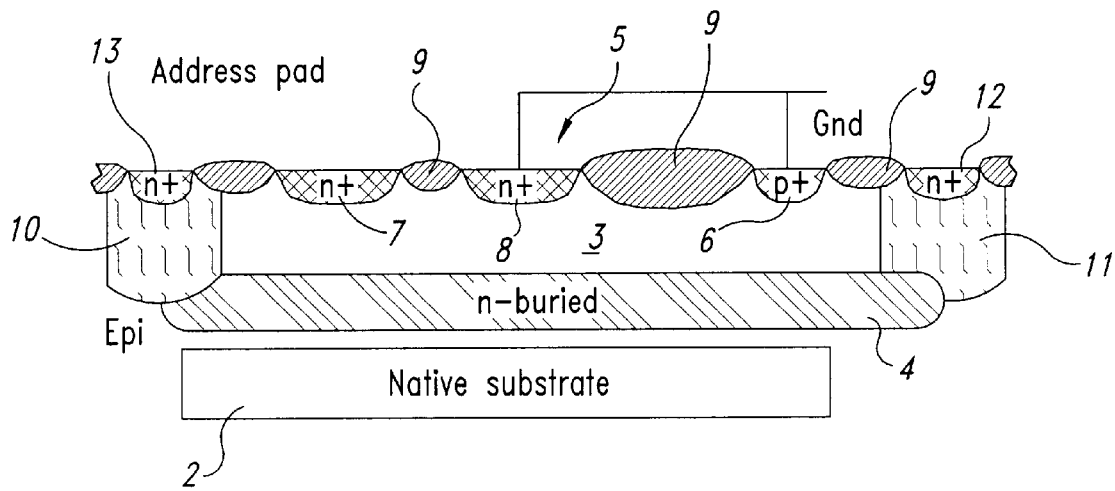
FIG. 5 shows schematically a second embodiment of the circuit structure according to this invention.

In this case, as clearly shown in FIG. 5, the lateral bipolar is fully isolated peripherally from the native substrate 2 by N-well barriers 10 and 11 in contact with the buried well 4.

The structure resulting from the interpenetration of the wells 10, 4 and 11 is an ip-well implant isolation integrated structure, that is a dummy triple-well realized with a CMOS process.

The well 10 is put in communication to a supply voltage reference Vdd by a contact region 13, in order to prevent any spurious powering on of parasitic vertical bipolars of both the npn and the pnp type.

Thus, the circuit structure 1 is provided with a buried well 4 acting as an isolating barrier from the native P+ substrate by increasing the base resistance of the lateral bipolar 5. This well 4 is also intended to make the triggering of the snap-back phenomenon more effective.

A preventive measure to be taken is that of maintaining a suitable distance between buried wells 4 underlying adjacent bipolar transistors 5.

Figure 6:
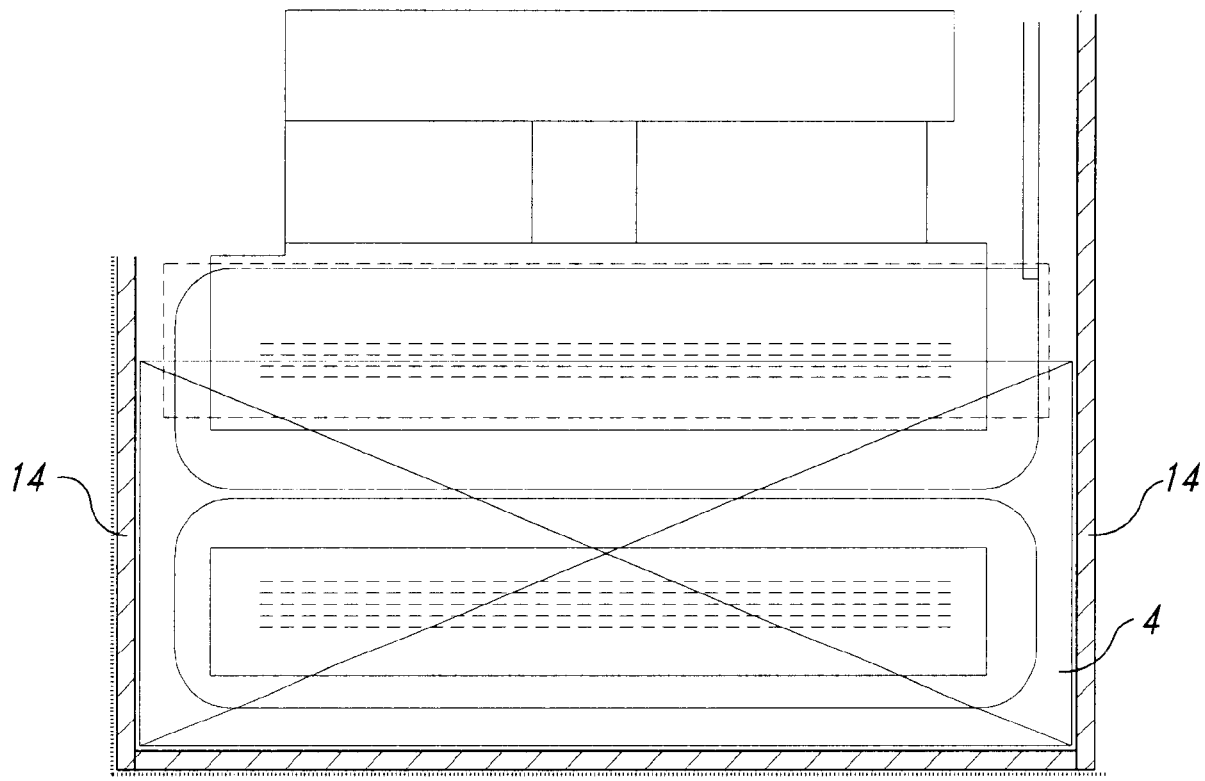
FIG. 6 is a schematic horizontal section view from above of the structure shown in FIG. 4.

A possible improvement to the circuit structure 1 of this invention is illustrated by FIG. 6 being horizontal section top view of FIG. 4.

In this further embodiment, the effective width of the bipolar 5 has been reduced. The N well 10 of the collector 7 has been extended to isolate the bipolar 5 at the sides by means of lateral rings 14 of the P+ type. The lateral well includes a lateral ring 14 that extends laterally around the transistor.

This lateral ring 14 significantly contributes toward reducing the base resistance of the lateral bipolar transistor.

Advantageously, the structure 1 can also be used with substrates having no epitaxial layers. In this case, a noise attenuation can be provided by introducing two separate ground references.

A first reference would be reserved for the output buffer, and the second reference serve the remaining circuitry.

In summary, the structure provides a more effective ESD protection using an isolation barrier which increases the base resistance of the ESD protection bipolar transistor.

The foregoing is achieved substantially independently of the parameters which govern the latch-up phenomena in ESDprotected electronic devices.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An ESD-protected circuit structure, comprising a semiconductor substrate overlaid with an epitaxial layer, at least one ESD protection lateral bipolar transistor realized in a surface of the epitaxial layer, and a buried well embedded in the epitaxial layer under said transistor for isolation of the transistor from the substrate.

2. A circuit structure according to claim 1, further comprising a first N well extending from a collector region of said transistor down to and in contact with the buried well.

3. A circuit structure according to claim 2, further comprising a second N well extending from a contact region of said transistor down to and in contact with the buried well.

4. A circuit structure according to claim 1, wherein said buried well is coupled to a voltage reference through a contact region.

5. A circuit structure according to claim 1, wherein said buried well is realized by a high-energy implantation.

6. An ESD-protected circuit structure, comprising a semiconductor substrate overlaid with an epitaxial layer, at least one ESD protection lateral bipolar transistor realized in a surface of the epitaxial layer, a buried well under said transistor for isolation of the transistor from the substrate, and a lateral well extending from the surface of the epitaxial layer to the buried well, the lateral well including a lateral ring that extends laterally around said transistor.

7. An ESD-protected circuit structure, comprising:

a semiconductor substrate having a first conductivity type;

an epitaxial layer grown on a surface of the semiconductor substrate;

a lateral bipolar transistor formed on a surface of the epitaxial layer; and a buried well having a second conductivity type opposite to the first conductivity type, the buried well being embedded in the epitaxial layer and positioned below the transistor to separate the transistor from the substrate.

8. The circuit structure of claim 7, further comprising a lateral well of the second conductivity type extending from a collector of the transistor to the buried well.

9. An ESD-protected circuit structure, comprising:

a semiconductor substrate having a first conductivity type;

a lateral bipolar transistor; and a buried well having a second conductivity type opposite to the first conductivity type, the buried well being positioned below the transistor to separate the transistor from the substrate; and a lateral well of the second conductivity type extending from a collector of the transistor to the buried well, wherein the lateral well includes a lateral ring that extends laterally around said transistor.

10. The circuit structure of claim 7, further comprising a lateral well of the second conductivity type extending from the buried well to a contact coupled to a voltage reference.

11. The circuit structure of claim 7, further comprising:

a first lateral well extending from a surface of the circuit structure to a first end of the buried well; and a second lateral well extending from the surface of the circuit structure to a second end of the buried well.

12. The circuit structure of claim 11 wherein the first lateral well contacts a collector of the transistor and the second lateral well contacts a contact region at the surface of the circuit structure.

13. An ESD-protected circuit structure, comprising:

a semiconductor substrate having a first conductivity type;

an epitaxial layer formed at a surface of the substrate;

a lateral bipolar transistor formed at a surface of the epitaxial layer;

a buried well having a second conductivity type opposite to the first conductivity type, the buried well being embedded in the epitaxial layer and positioned below the transistor to separate the transistor from the substrate;

a first lateral well extending from a surface of the epitaxial layer to a first end of the buried well and contacting a collector of the transistor; and a second lateral well extending from a surface of the epitaxial layer to a second end of the buried well and contacting a contact region at the surface of the circuit structure.

* * * * *